(12) United States Patent
Yuan et al.

(10) Patent No.: US 9,035,679 B2
(45) Date of Patent: May 19, 2015

(54) STANDARD CELL CONNECTION FOR CIRCUIT ROUTING

(71) Applicant: GLOBALFOUNDRIES Inc., Grand Cayman (KY)

(72) Inventors: Lei Yuan, Cupertino, CA (US); Mahbub Rashed, Cupertino, CA (US); Irene Yuh-Ling Lin, Los Altos Hill, CA (US); Jongwook Kye, Pleasanton, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 118 days.

(21) Appl. No.: 13/886,423

(22) Filed: May 3, 2013

(65) Prior Publication Data

US 2014/0327153 A1 Nov. 6, 2014

(51) Int. Cl.
*G06F 17/50* (2006.01)
*H01L 23/522* (2006.01)
*H01L 27/02* (2006.01)
*H01L 27/118* (2006.01)
*H01L 23/528* (2006.01)

(52) U.S. Cl.
CPC ........ *G06F 17/5077* (2013.01); *H01L 23/5221* (2013.01); *H01L 2924/0002* (2013.01); *H01L 23/5286* (2013.01); *H01L 27/0207* (2013.01); *H01L 27/11807* (2013.01)

(58) Field of Classification Search
CPC .................... G06F 17/5077; H01L 23/5226
USPC .............. 326/102, 103, 41, 47; 257/211, 635, 257/758, 776
See application file for complete search history.

(56) References Cited

U.S. PATENT DOCUMENTS

| | | |
|---|---|---|
| 5,987,086 A | 11/1999 | Raman et al. |
| 7,068,070 B2 | 6/2006 | Or-Bach |
| 2004/0222442 A1* | 11/2004 | Komaki ........................ 257/202 |
| 2013/0104095 A1 | 4/2013 | Waller |

* cited by examiner

*Primary Examiner* — Daniel D Chang
(74) *Attorney, Agent, or Firm* — Williams Morgan, P.C.

(57) ABSTRACT

Embodiments described herein provide approaches for improving a standard cell connection for circuit routing. Specifically, provided is an IC device having a plurality of cells, a first metal layer (M1) pin coupled to a contact bar extending from a first cell of the plurality of cells, and a second metal layer (M2) wire coupled to the contact bar, wherein the contact bar extends across at least one power rail. By extending the contact bar into an open area between the plurality of cells to couple the M1 pin and the M2 wire, routing efficiency and chip scaling are improved.

15 Claims, 5 Drawing Sheets

US 9,035,679 B2

STANDARD CELL CONNECTION FOR CIRCUIT ROUTING

BACKGROUND

1. Technical Field

This invention relates generally to integrated circuit (IC) cell design and, more particularly, to manufacturing approaches for enhanced circuit routing.

2. Related Art

Computer-aided cell-based design has been developed for quickly designing large scale ICs such as application specific integrated circuits (ASICs) and gate arrays. The cell is a circuit that has been pre-designed and pre-verified as a building block. Design technologies known as standard cell and gate array use different types of such building blocks. In a standard cell design, each distinct cell in a library may have unique geometries of active, gate, and metal levels. Examples of a standard cell or gate array cell include an inverter, a NAND gate, a NOR gate, a flip-flop, and other similar logic circuits.

During the process of designing an integrated circuit, a designer may select particular cells from a library of cells and use them in a design. The library includes cells that have been designed for a given IC manufacturing process, such as complementary metal oxide semiconductor (CMOS) fabrication. The cells generally have a fixed height but a variable width, which enables the cells to be placed in rows. Cells typically do not change from one design to the next, but the way in which they are interconnected will, to achieve the desired function in a given design. By being able to select the cells from the library for use in the design, the designer can quickly implement a desired functionality without having to custom design the entire integrated circuit from scratch. Thus, the designer will have a certain level of confidence that the integrated circuit will work as intended when manufactured without having to worry about the details of the individual transistors that make up each cell.

Cells are normally designed so that routing connections between cells can be made as efficiently as possible. Routing in an IC design is accomplished through routing elements, such as wires in one or more metal layers. Each metal layer is separated from other metal layers by insulating layers, and vias connect one metal layer to another. These routing elements perform at least two functions: they connect individual transistors that make up a cell, and they connect cells to each other globally (i.e., on a chip-level) to implement the desired functionality of the integrated circuit. For example, clock signals, reset signals, test signals, and supply voltages may be carried through these routing elements. A well-designed cell layout minimizes congestion in routing global interconnections, which reduces the number of metal layers in or overall size of an integrated circuit layout.

As shown in the prior art standard cell of FIGS. 1-2, a common standard cell architecture will have metal 1 (M1) pins that are primarily on a vertical orientation and connected by horizontal metal 2 (M2) wires. As the cell height is fixed, the available horizontal M2 routing resources to connect each cell are also fixed. Therefore, when no horizontal M2 route resource is available to connect to the M1 pin, a bended M2 wire may be used, as shown in FIG. 2. However, the bended M2 wire is inefficient as it blocks other horizontal M2 tracks. Furthermore, in some current library architectures, an M2 power rail is provided to reduce current density on existing M1 power rails and to improve circuit reliability. Unfortunately, this makes cross-power-rail M2 bending impossible. Therefore, what is needed is a solution to at least this deficiency of the prior art.

SUMMARY

In general, embodiments described herein provide approaches for an improved standard cell connection for circuit routing. Specifically, provided is an IC device having a plurality of cells, a first metal layer (M1) pin coupled to a contact bar extending from a first cell of the plurality of cells, and a second metal layer (M2) wire coupled to the contact bar, wherein the contact bar extends across at least one power rail. By extending the contact bar into an open area between the plurality of cells to couple the M1 pin and the M2 wire, routing efficiency and chip scaling are improved.

One aspect of the present invention includes an integrated circuit (IC) device comprising: a plurality of cells; a first metal layer (M1) pin coupled to a contact bar extending from a first cell of the plurality of cells; and a second metal layer (M2) wire coupled to the contact bar, wherein the contact bar extends across at least one power rail.

Another aspect of the present invention includes a computer program product for an improved standard cell connection for circuit routing, the computer program product comprising: a computer readable storage device storing computer program instructions, the computer program instructions being executable by a computer, the computer program instructions including: providing a plurality of cells; forming a first metal layer (M1) pin coupled to a contact bar extending from a first cell of the plurality of cells; and forming a second metal layer (M2) wire coupled to the contact bar, wherein the contact bar extends across at least one power rail.

Another aspect of the present invention provides a method for an improved standard cell connection for circuit routing in an integrated circuit (IC), the method comprising: providing a plurality of cells; forming a first metal layer (M1) pin coupled to a contact bar extending from a first cell of the plurality of cells; and forming a second metal layer (M2) wire coupled to the contact bar, wherein the contact bar extends across at least one power rail.

BRIEF DESCRIPTION OF THE DRAWINGS

These and other features of this invention will be more readily understood from the following detailed description of the various aspects of the invention taken in conjunction with the accompanying drawings in which.

Figure 1:
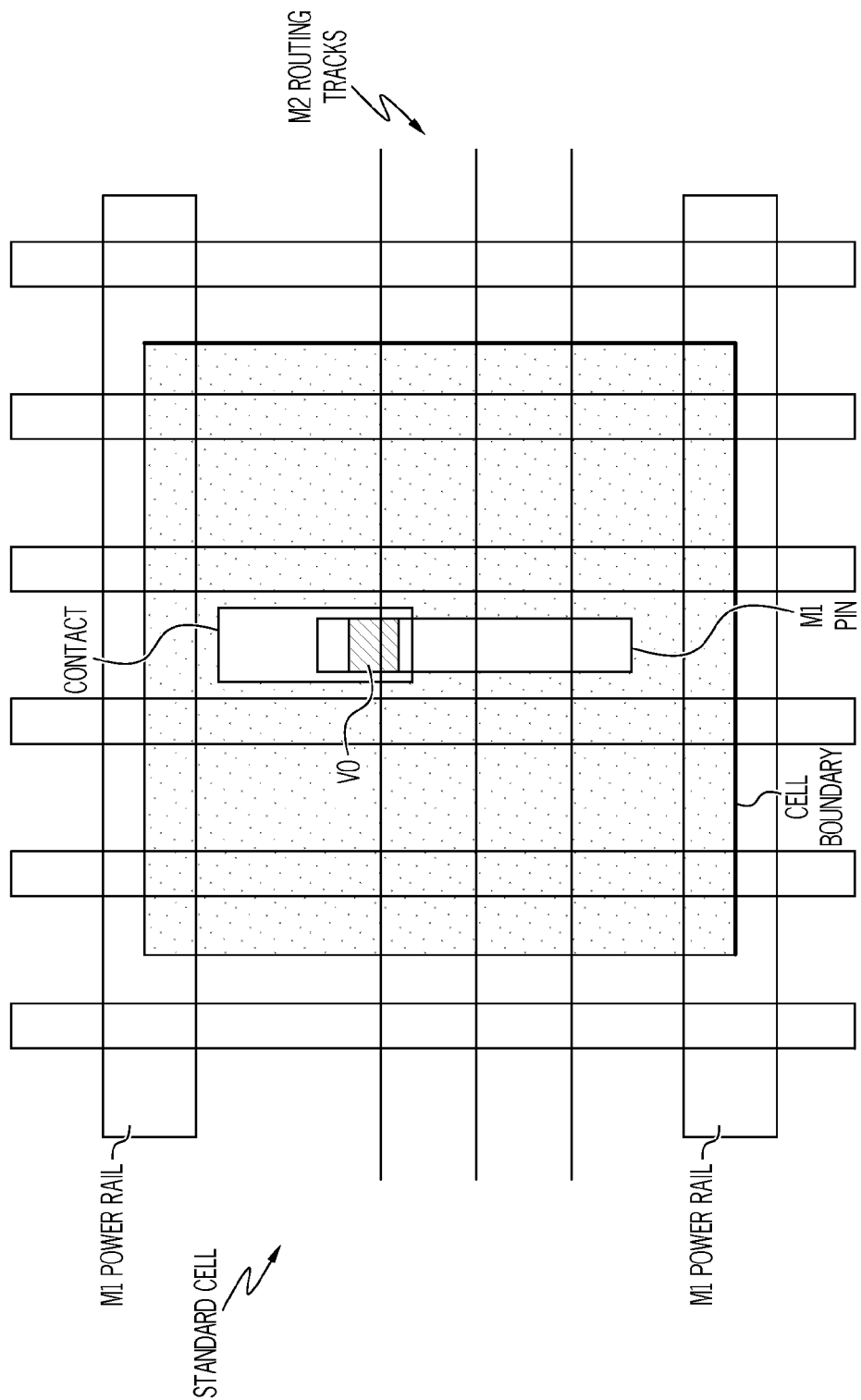
FIG. 1 shows a top view of a prior art semiconductor device.
Figure 2:
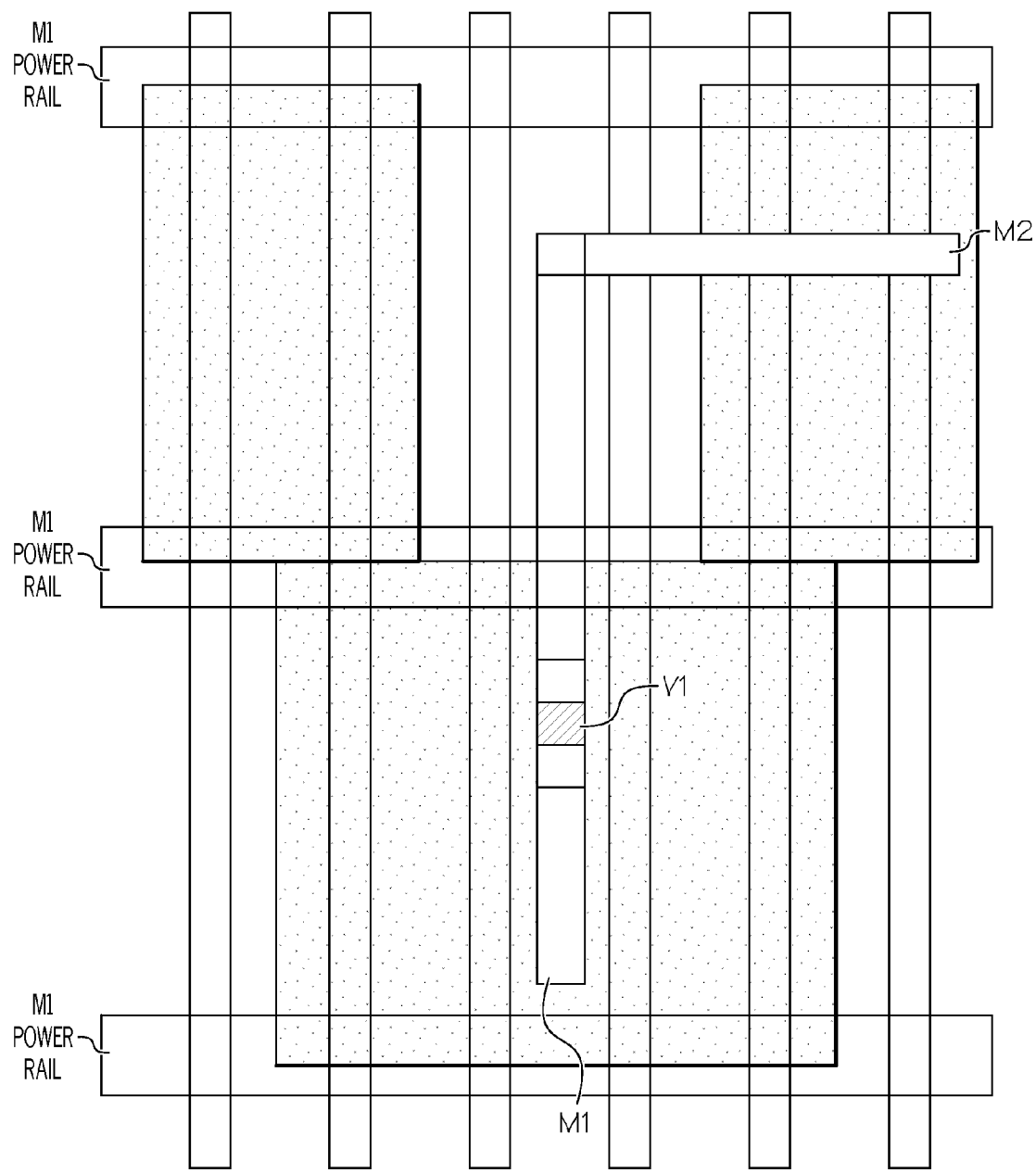
FIG. 2 shows a top view of a prior art semiconductor device with a bended M2 wire.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Exemplary embodiments will now be described more fully herein with reference to the accompanying drawings, in which exemplary embodiments are shown. Described are methods and techniques used for an improved standard cell connection for circuit routing. Specifically, provided is an IC device having a plurality of cells, a first metal layer (M1) pin coupled to a contact bar extending from a first cell of the plurality of cells, and a second metal layer (M2) wire coupled to the contact bar, wherein the contact bar extends across at least one power rail. By extending the contact bar into an open area between the plurality of cells to couple the M1 pin and the M2 wire, routing efficiency and chip scaling are improved.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

A cell described herein refers to predefined circuit unit or circuit element that is provided, as part of a cell library of many different types of circuit units, to an integrated circuit designer. The cell is typically re-used in multiple instances as needed to make up the integrated circuit. For example, a cell may be an inverter, a NAND gate, a NOR gate, a flip flop, and other similar logic circuits. Each cell has a boundary, typically consisting of four edges that form a rectangular shape. A cell pin, (i.e., metal pin, pin, etc.) described herein refers to metal wires within a cell that serve as connection points for external connections to a cell (e.g., connections between one cell and another cell). Cell pins are sometimes referred to as cell ports, although the term cell pin is meant to include both cell pins and cell ports. Cell pins may be input pins, which are the connection points for the input signals of a standard cell. Cell pins may be output pins, which are connection points for the output signals of a standard cell. The locations of the pins are designated by the designer of the cell when creating. As will be described in further detail below, the present invention extends a contact bar across at least one power rail to route and extend the M1 pin.

Figure 3:
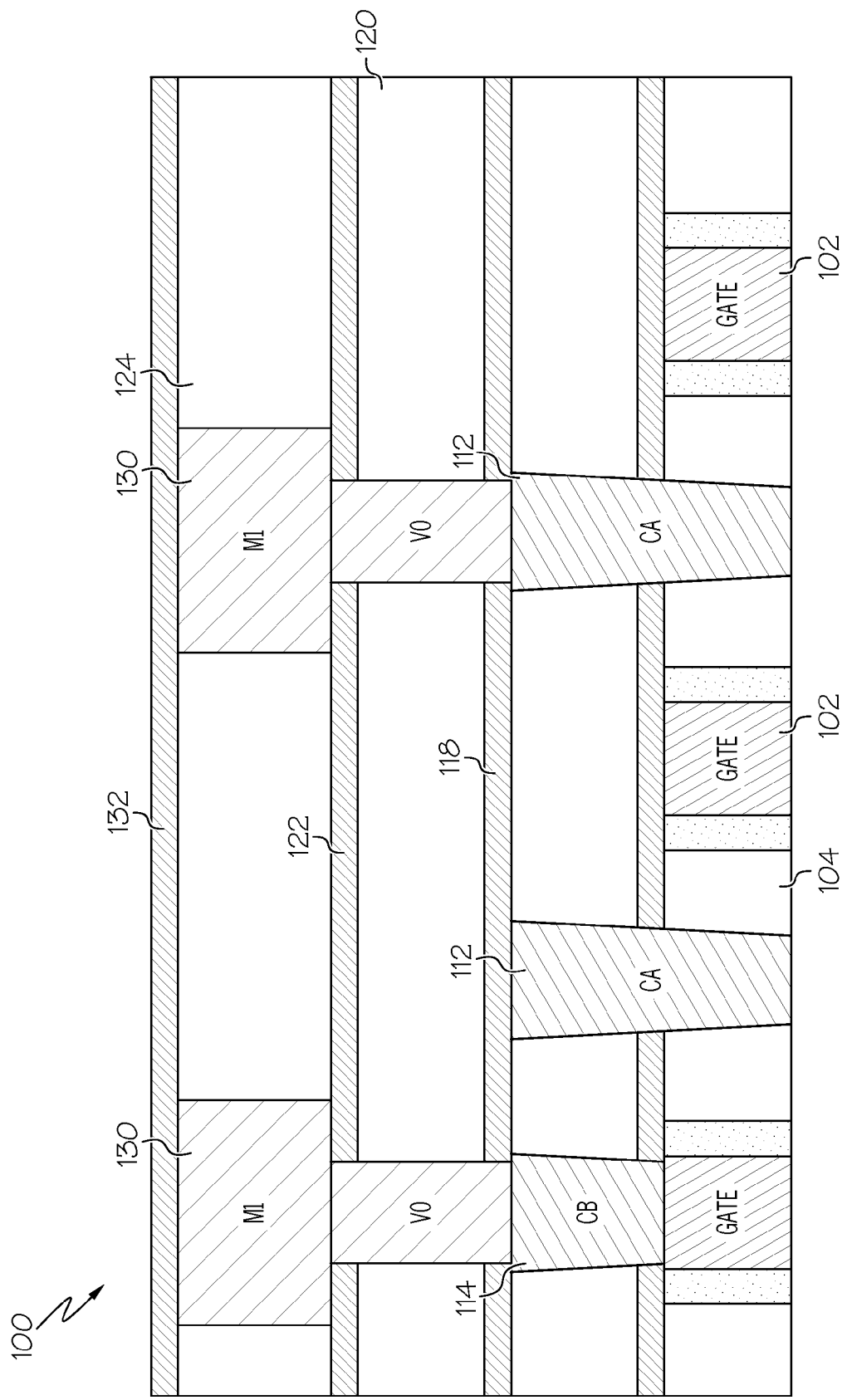
FIG. 3 shows a side cross-sectional view of an IC device following its formation according to an illustrative embodiment.

With reference again to the figures, the formation of an exemplary IC device will now be shown and described. FIG. 3 shows a cross section of IC device 100 following formation of a set of gates 102 in dielectric material 104, and a subsequent deposition and planarization of a hard mask (not shown).

IC device 100 further comprises source/drain (S/D) contacts 112, formed by a Ca pattern defined in the photoresist by a lithography process. A selective Ca etch is performed to remove the opened (i.e., exposed) dielectric material and hard mask, and the remaining trenches are filled with a conductive material (e.g., Tungsten) to form Ca contacts 112. This process is repeated to form gate contacts 114 in IC device 100. Again, a Cb pattern is defined in the photoresist by a lithography process. A selective Cb etch is then performed to remove the opened (i.e., exposed) dielectric material and hard mask, and the remaining trenches are filled with a conductive material (e.g., Tungsten) to form Cb contacts 114.

IC device 100 further comprises a second hard mask layer 118 formed over Ca contacts 112 and Cb contacts 114, a third dielectric layer 120 formed over second hard mask layer 118, a third hard mask layer 122 formed over third dielectric layer 120, and a fourth dielectric layer 124 formed over third mask layer 122.

IC device 100 further comprises first metal layers 130 and V0, and a metal cap 132 is atop first metal layers 130, as shown in FIG. 3.

Figure 4:
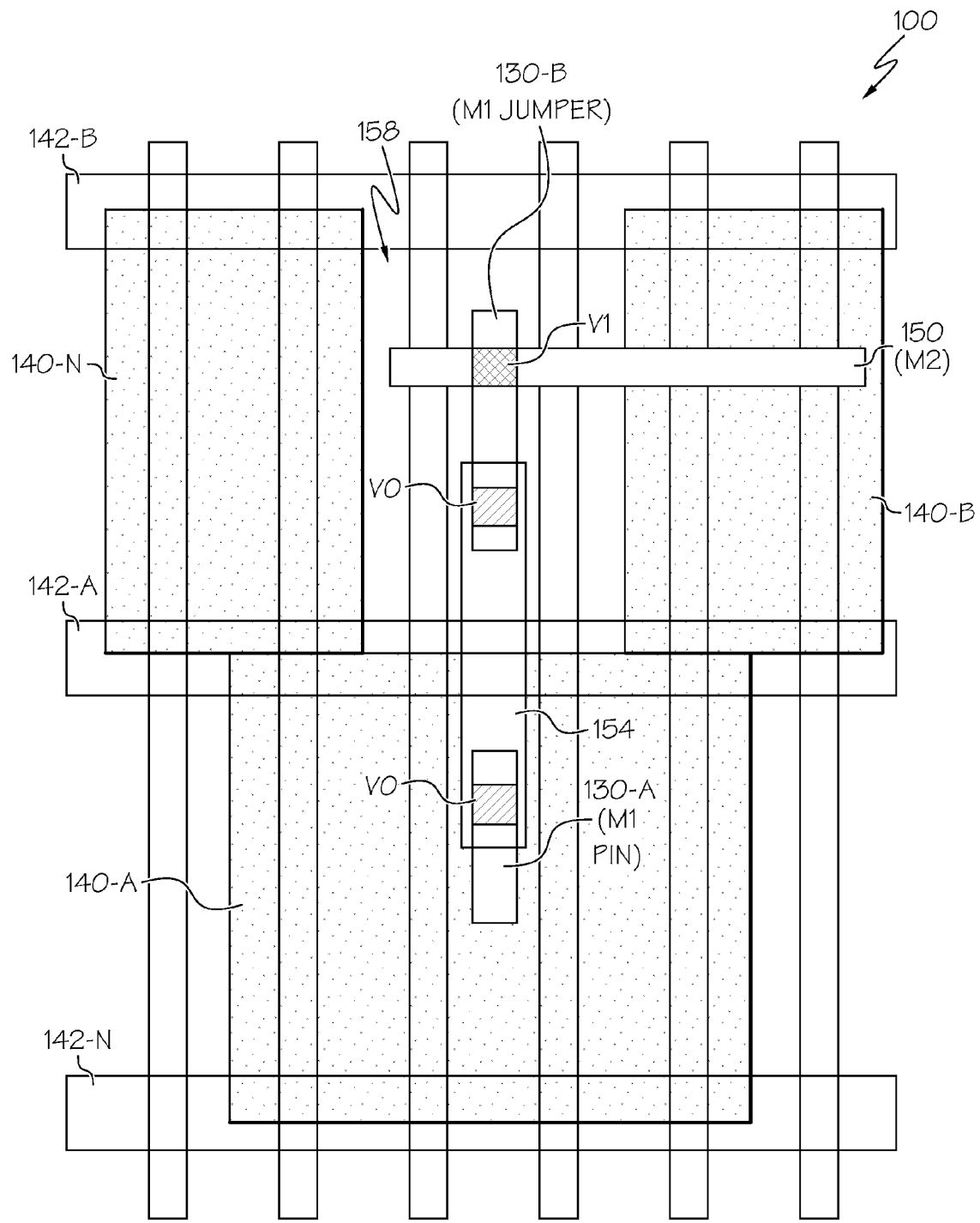
FIG. 4 shows a top cross sectional view of the IC device following its formation according to illustrative embodiments.

Turning now to FIG. 4, a top view of IC 100 according to exemplary embodiments of the invention is shown and described in greater detail. As depicted, IC 100 comprises a plurality of cells 140A-N and a set of power rails 142A-N extending along intersections between one or more cells. A first metal layer (M1) pin 130-A is shown formed on first cell 140A, and couples with V0. Also shown is a second metal layer (M2) 150 extending from a second cell row. To improve routing efficiency and chip scaling, provided is a contact bar 154 configured to extend across a boundary of first cell 140A and power rail 142A, thereby connecting M1 pin 130-A with an M1 jumper 130-B and second metal layer 150. As shown, M1 jumper 130-B is generated on contact bar 154, and couples to second metal layer 150 at V1.

In exemplary embodiments, contact bar 154 is formed to extend into an open (i.e., free) area 158 of IC device 100 between plurality of cells 140A-N. That is, inherent to the manufacture and design process, is a large number of open areas that are generally underutilized. However, the approach herein takes advantage of this space by extending contact bar 154 across the boundary of first cell 140A and power rail 142A, and into open area 158. Contact bar 154 passes under power rail 142A to connect M1 and M2 via M1 jumper 130-B Therefore, contact bar 154 provides this connection to enable the desired functionality for the design.

Figure 5:
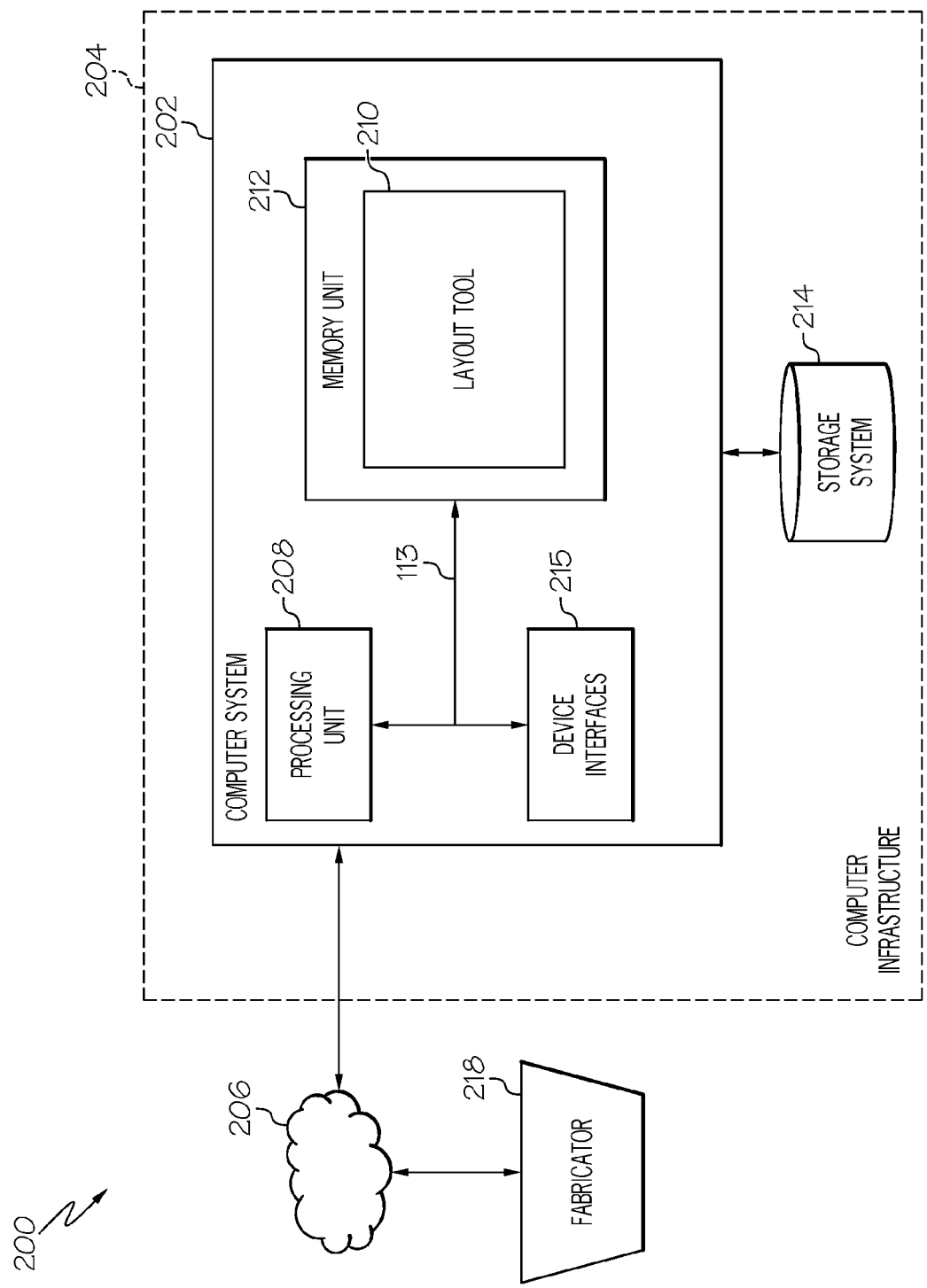
FIG. 5 shows a schematic of an exemplary computing environment according to illustrative embodiments.

Turning now to FIG. 5, depicted is a system 200 that facilitates extending pin accessibility for circuit routing in an integrated circuit (IC). As shown, system 200 includes computer system 202 deployed within a computer infrastructure 204. This is intended to demonstrate, among other things, that embodiments can be implemented within a network environment 206 (e.g., the Internet, a wide area network (WAN), a local area network (LAN), a virtual private network (VPN), etc.), a cloud-computing environment, or on a stand-alone computer system. Still yet, computer infrastructure 204 is intended to demonstrate that some or all of the components of system 200 could be deployed, managed, serviced, etc., by a service provider who offers to implement, deploy, and/or perform the functions of the present invention for others.

Computer system 202 is intended to represent any type of computer system that may be implemented in deploying/realizing the teachings recited herein. In this particular example, computer system 202 represents an illustrative system for an improved standard cell connection for circuit routing in an IC. It should be understood that any other computers implemented under various embodiments may have different components/software, but will perform similar functions. As shown, computer system 202 includes a processing unit 208 capable of operating with a layout tool 210 stored in a memory unit 212 to provide pin accessibility for circuit routing. Also shown is a bus 213, and device interfaces 215.

Processing unit 208 refers, generally, to any apparatus that performs logic operations, computational tasks, control functions, etc. A processor may include one or more subsystems, components, and/or other processors. A processor will typically include various logic components that operate using a clock signal to latch data, advance logic states, synchronize computations and logic operations, and/or provide other timing functions. During operation, processing unit 108 receives signals transmitted over a LAN and/or a WAN (e.g., T1, T3, 56 kb, X.25), broadband connections (ISDN, Frame Relay, ATM), wireless links (802.11, Bluetooth, etc.), and so on. In some embodiments, the signals may be encrypted using, for example, trusted key-pair encryption. Different systems may transmit information using different communication pathways, such as Ethernet or wireless networks, direct serial or parallel connections, USB, Firewire®, Bluetooth®, or other proprietary interfaces. (Firewire is a registered trademark of Apple Computer, Inc. Bluetooth is a registered trademark of Bluetooth Special Interest Group (SIG)).

In general, processing unit 208 executes computer program code, such as program code for layout tool 210, which is stored in memory unit 212 and/or storage system 214. While executing computer program code, processing unit 208 can read and/or write data to/from memory unit 212 and storage system 214. Storage system 214 may comprise VCRs, DVRs, RAID arrays, USB hard drives, optical disk recorders, flash storage devices, and/or any other data processing and storage elements for storing and/or processing data. Although not shown, computer system 202 could also include I/O interfaces that communicate with one or more hardware components of computer infrastructure 204 that enable a user to interact with computer system 202 (e.g., a keyboard, a display, camera, etc.). Layout tool 210 of computer infrastructure 204 is configured to operate with a fabricator 218 for designing and patterning features of an IC.

Furthermore, in various embodiments, layout tool 210 can be provided and configured to create the datasets used to pattern the semiconductor layers as described herein. For example data sets can be created to generate photomasks used during lithography operations to pattern the layers for structures as described herein. Such design tools can include a collection of one or more modules and can also be comprised of hardware, software or a combination thereof. Thus, for example, layout tool 210 can be a collection of one or more software modules, hardware modules, software/hardware modules or any combination or permutation thereof. As another example, layout tool 210 can be a computing device or other appliance on which software runs or in which hardware is implemented. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

It is apparent that there has been provided approaches for an improved standard cell connection for circuit routing. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. An integrated circuit (IC) device comprising:
   a plurality of cells;
   a first metal layer (M1) pin coupled to a contact bar extending from a first cell of the plurality of cells;
   an M1 jumper; and
   a second metal layer (M2) wire coupled to the contact bar, wherein the contact bar extends across at least one power rail, and the M1 jumper couples the M2 wire and the contact bar.

2. The IC device of claim 1, further comprising extending the contact bar across a boundary of the first cell of the plurality of cells.

3. The IC device of claim 1, the contact bar coupled to the M1 jumper in an open region between the plurality of cells.

4. The IC device of claim 3, the M2 wire coupled to the M1 jumper in the open region.

5. The IC device of claim 1, further comprising a set of power rails each extending along an intersection of cells from the plurality of cells.

6. A computer program product for an improved standard cell connection for circuit routing, the computer program product comprising:
   a computer readable storage device storing computer program instructions, the computer program instructions being executable by a computer, the computer program instructions including:

providing a plurality of cells;
forming a first metal layer (M1) pin coupled to a contact bar extending from a first cell of the plurality of cells;
forming a second metal layer (M2) wire coupled to the contact bar, wherein the contact bar extends across at least one power rail; and
forming an M1 jumper to couple the M2 wire and the contact bar.

7. The computer program product of claim 6, the first contact bar extending across a boundary of the first cell of the plurality of cells.

8. The computer program product of claim 6, the computer program instructions further comprising coupling the contact bar to the M1 jumper in an open region between the plurality of cells.

9. The computer program product of claim 8, the computer program instructions further comprising coupling the M2 wire to the M1 jumper in the open region.

10. The computer program product of claim 6, the computer program instructions further comprising forming a set of power rails each extending along an intersection of cells from the plurality of cells.

11. A method for an improved standard cell connection for circuit routing in an integrated circuit (IC), the method comprising:
providing a plurality of cells;
forming a first metal layer (M1) pin coupled to a contact bar extending from a first cell of the plurality of cells;
forming a second metal layer (M2) wire coupled to the contact bar, wherein the contact bar extends across at least one power rail; and
forming an M1 jumper to couple the M2 wire and the contact bar.

12. The method of claim 11, further comprising extending the contact bar across a boundary of the first cell of the plurality of cells.

13. The method of claim 11, further comprising coupling the contact bar to the M1 jumper in an open region between the plurality of cells.

14. The method of claim 13, further comprising coupling the M2 wire to the M1 jumper in the open region.

15. The method of claim 11, further comprising forming a set of power rails each extending along an intersection of cells from the plurality of cells.

\* \* \* \* \*